US009251603B1

(12) United States Patent
Kozko

(10) Patent No.: US 9,251,603 B1
(45) Date of Patent: Feb. 2, 2016

(54) INTEGRATING PANORAMIC VIDEO FROM A HISTORIC EVENT WITH A VIDEO GAME

(71) Applicant: Dmitry Kozko, Aventura, FL (US)

(72) Inventor: Dmitry Kozko, Aventura, FL (US)

(*) Notice: Subject to any disclaimer, the term of this patent is extended or adjusted under 35 U.S.C. 154(b) by 0 days.

(21) Appl. No.: 14/091,468

(22) Filed: Nov. 27, 2013

Related U.S. Application Data

(60) Provisional application No. 61/853,711, filed on Apr. 10, 2013, provisional application No. 61/854,397, filed on Apr. 23, 2013.

(51) Int. Cl.
*G06T 11/00* (2006.01)
*G06T 19/00* (2011.01)

(52) U.S. Cl.
CPC .............. *G06T 11/00* (2013.01); *G06T 19/00* (2013.01)

(58) Field of Classification Search
CPC ........... G09G 5/14; G09G 5/395; G06T 19/00
USPC ......................................... 345/629, 632, 641
See application file for complete search history.

(56) References Cited

U.S. PATENT DOCUMENTS

| 2006/0223637 | A1* | 10/2006 | Rosenberg | A63F 13/10 463/47 |
| 2008/0266324 | A1* | 10/2008 | Lynch | G01C 21/20 345/634 |
| 2010/0035692 | A1* | 2/2010 | Reville et al. | 463/42 |
| 2014/0087877 | A1* | 3/2014 | Krishnan | 463/33 |
| 2014/0146152 | A1* | 5/2014 | Frashure | G03B 15/00 348/77 |

* cited by examiner

*Primary Examiner* — Chante Harrison
(74) *Attorney, Agent, or Firm* — Patents on Demand P.A.; Brian K. Buchheit; Scott M. Garrett

(57) ABSTRACT

A panoramic video of a real world event can be received. The video can include perspective data linked with a video timeline. A perspective view associated with a graphics of a video game linked with a game timeline at a first time index can be determined. The perspective data of the panoramic video can be processed to obtain a video sequence matching the perspective view associated with the graphics at a second time index. The video timeline and the game timeline can be synchronized based on a common time index of each of the timelines. The graphics and the video sequence can be integrated into an interactive content, responsive to the synchronizing.

20 Claims, 4 Drawing Sheets

INTEGRATING PANORAMIC VIDEO FROM A HISTORIC EVENT WITH A VIDEO GAME

CROSS-REFERENCE TO RELATED APPLICATIONS

This application claims priority to provisional application No. 61/853,711, entitled "System and Method for Stitching Videos Received from Multiple Unsynchronized Cameras", filed Apr. 10, 2013, as well as provisional application No. 61/854,397, entitled "360 Degrees Cameras", filed Apr. 23, 2013. Both provisional applications are hereby included in their entirety.

BACKGROUND

The present invention relates to the field of video game simulation and, more particularly, to integrating panoramic video from a historic event with a video game.

Many popular sporting events often have a video game tie-in which can allow gamers and/or sports enthusiasts to experience a video game simulation of a popular sporting event. Often times, these video game simulations can take the form of football simulation games (e.g., Madden NFL series) and racing simulation games (e.g., NASCAR Racing 2003 Season). That is, these games attempt to recreate a realistic environment which can permit players to interact with computer controlled versions of their favorite team. Racing simulation games are quickly becoming favorites among sporting audiences and gamers alike. These games often offer a racing competition with various types of land, air, or sea vehicles. The games can typically offer players interaction with computer simulations of real-world racing leagues and real-world racing drivers. In general, they can be distributed along a spectrum anywhere between realistic simulations to arcade racing games.

Many realistic simulations simulate real-world vehicle constraints such as fuel usage, damage, tire wear and grip, and suspension settings. The principal objective of these simulations is to create a sense of realism which draw players into the game. However, these games often lack the realism of specific sporting events and occurrences of these sporting events. Consequently, these games often quickly become dated and offer static gameplay. For example, often times sports enthusiasts want the chance to make a decision for a racing driver during a critical point of a sporting event to see the outcome of their actions, instead of the outcome of the driver's decision. That is, players cannot experience and/or replay their favorite sporting event moments within a simulation game.

BRIEF SUMMARY

One aspect of the present invention can include a system, a computer program produce, an apparatus, and a method for integrating panoramic video from a historic event with a video game. A panoramic video of a real world event can be received. The video can include perspective data linked with a video timeline. A perspective view associated with a graphics of a video game linked with a game timeline at a first time index can be determined. The perspective data of the panoramic video can be processed to obtain a video sequence matching the perspective view associated with the graphics at a second time index. The video timeline and the game timeline can be synchronized based on a common time index of each of the timelines. The graphics and the video sequence can be integrated into an interactive content, responsive to the synchronizing.

Another aspect of the present invention can include a method, a computer program produce, an apparatus, and a system for integrating panoramic video from a historic event with a video game. A compositing engine can be configured to generate an interactive content comprising of a video game graphics and a video sequence. The graphics can be associated with a video game environment of a video game. The video sequence can be a portion of a panoramic video of a real world event. A data store can be able to persist the interactive content and/or a panoramic video metadata.

DETAILED DESCRIPTION

Figure 1A:
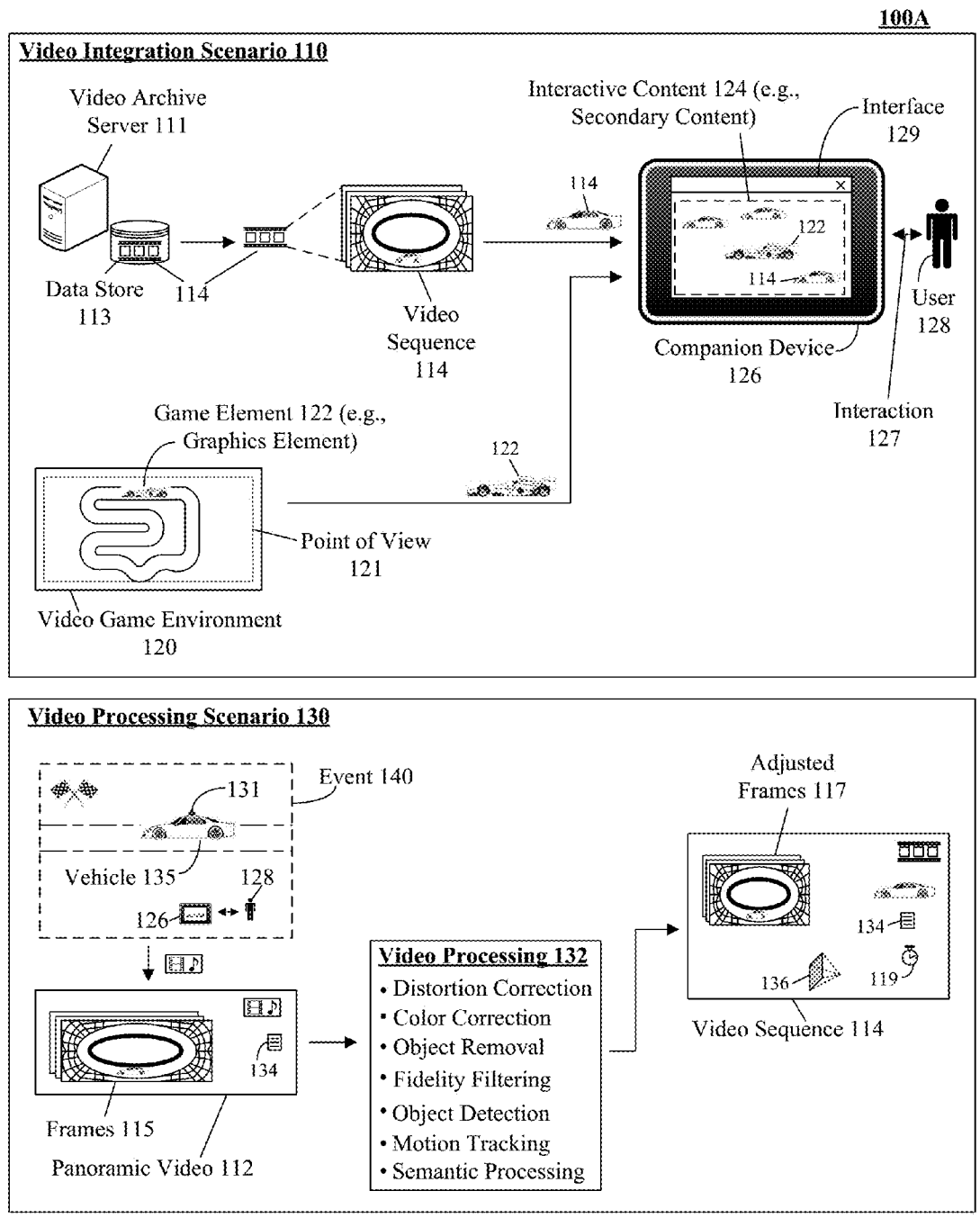
FIG. 1A is a schematic diagram illustrating a set of scenarios for integrating panoramic video from a historic event with a video game in accordance with an embodiment of the inventive arrangements disclosed herein.

The present disclosure is a solution for integrating video from real-world cameras into a video game simulation environment. In the solution, cameras within a real-world environment can capture one or more videos of the environment and/or environmental elements. For example, a video camera mounted on a racing car can capture panoramic video of the car as the car races around a racing track during a racing event. In one embodiment, the captured video can be processed and integrated with a video game. In the embodiment, a composite environment can be created utilizing captured video to simulate event occurrences and/or event environment. For example, the disclosure can be utilized within a companion device as a second screen application (e.g., custom content) to enhance a live event viewing (e.g., in a stadium, at home in front of a television) by an audience (e.g., spectator). It should be appreciated that the video and game can be synchronized (e.g., to each other, to an external event, etc) enabling a cohesive user experience.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions.

These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

FIG. 1A is a schematic diagram illustrating a set of scenarios 110, 130 for integrating video from real-world cameras into a video game simulation environment in accordance with an embodiment of the inventive arrangements disclosed herein. Scenario 110, 130 can be performed in the order presented herein or can be performed out of order. In scenario 110, sequence 114 can be presented within interface 129 to enhance a user 128 interaction 127 with content 124. In scenario 130, a video sequence 114 can be extracted from panoramic video 112 of an event 140.

Content 124 can be a user interactive media which can enhance a user 128 experience of an event 140. Content 124 can include, but is not limited to, a video sequence 114, a game element 122 (e.g., interactive graphics object), and the like. Content 124 can be associated with a point of view which can change during the course of user interaction 127 and/or viewing. The point of view can include, a first person point of view, a third person point of view, and the like. It should be appreciated that the point of view can be a perspective based view (e.g., first person perspective).

In one instance, content 124 can be presented within interface 129 after event 140. In another instance, content 124 can be presented during event 140 with an appreciable delay (e.g., broadcasting delay, network latency). That is, user 128 can experience customized interactive content which can enhance the viewing of event 140. It should be appreciated that the disclosure is not limited to viewing event 140, and can include other embodiments in which user 128 can utilize content 124 to experience a realistic simulation of an event 140 with user interactive characteristics. In one embodiment, content 124 can include an automotive racing content, a racing simulation (e.g., marine racing), and the like. For example, content 124 can replicate a NASCAR racing championship event (e.g., event 140) in which the user can perform limited actions which can affect the content 124.

In scenario 110, a video archive server 111 can be communicatively linked to a data store 113. Data store 113 can store sequence 114 which can include one or more portions of panoramic video 112. In one instance, sequence 114 can include footage of real world objects traversing and/or acting within an event 140. For example sequence 114 can be a spectator reaction to an accident during event 140. In one embodiment, sequence can 114 be presented at an appropriate time during user interaction 127 with content 124. For example, when the user 128 is operating a game element 122 (e.g., car) and crashes into a computer controlled car, a video sequence 114 of an audience reaction can be presented within a picture-in-picture (PiP) window of interface 129.

Video game environment 120 can include one or more game elements 122 which can be extracted and presented within content 124. For example, element 122 can be superimposed upon a video sequence of car drifting around a street corner. It should be appreciated that environment and/or element can be associated with one or more perspective point of views 121. For example, environment 120 can be a racing simulation with a third person view and a first person point of view depending on a user selection (e.g., FIG. 1B). In one embodiment, sequence 114 can be overlayed within environment 120, permitting dynamic video content (e.g., sequence 114) to enhance gameplay of environment 120. In one instance, element 122 can be associated with a timeline of the game environment 120. That is, element 122 is synchronized with game environment 120.

In one instance, sequence 114 and element 122 can be synchronized based on timing data (e.g., 119), an event timeline (e.g., environment 120 timeline, event 140), and the like. In one embodiment, sequence 114 can be utilized to recreate real world limitations. For example, sequence 114 can be utilized to replicate a pit stop in which a driver is unable to race during the pit stop. In one instance, sequence 114 can interrupt user interaction 127 when a specific user action and/or time marker is reached. In one configuration of the instance, sequence 114 can be utilized as a cut away to simulate an occurrence within event 140 in which user 128 is unable to perform actions. In another configuration of the instance, user interaction 127 can be suppressed. The interaction 127 can resume when the sequence 114 has ended.

It should be appreciated that the content 124 can include a master timeline to which element 122 and/or sequence 114 can be synchronized. In one embodiment, user 128 can adjust playback of video sequence 114 utilizing the master timeline which can appropriately affect element 122.

In scenario 130, event 140 can be recorded utilizing panoramic camera 131. In one instance, camera 131 can be a three hundred and sixty degree camera with fixed directional lenses and a stitching lense mounted on the roof of a vehicle 135 during event 140. For example, during event 140, a hood mounted panoramic camera 131 can capture panoramic video 112 of an event 140 from the point of view of the vehicle 135. It should be appreciated that the disclosure can utilize multiple cameras 131 to obtain panoramic video 112.

In one embodiment, metadata 134 within video 112 can be utilized to determine an appropriate point of view 136 for usage within content 124. In the instance, the disclosure can appropriately match a point of view of content 124 with a video sequence having a similar or identical point of view, and vice versa. For example, when content is of a driver's perspective (e.g., element 122), a video sequence 114 of a first person perspective (e.g., from the point of view of a driver in the same approximate view) can be presented to show a realistic view from the point of view of car (e.g., element 122). That is, based on the point of view of content 124, an appropriate sequence 114 can be obtained and utilized (e.g., FIG. 1B). In essence, the disclosure can approximately match a camera angle of video 112 with a virtual camera angle of a game environment 120 and vice versa.

Panoramic video 112 can be a digital media with an elongated field of view. Video 112 can be created from one or more cameras, one or more lenses, and/or one or more videos. In one embodiment, video 112 can be an immersive video. In the embodiment, immersive video can be a video recording of a real world scene/environment, where the view in every direction is recorded at the same time. During playback the viewer can control the viewing direction (e.g., up, down, sideways, zoom).

Video 112 can include one or more frames 115, metadata 134, and the like. Video 112 can undergo video processing 132 which can prepare video for usage within content 124. For example, processing can adjust the aspect ratio of frames 115 to produce adjusted frames 117 which are compatible with the aspect ratio of content 124 or element 122. Processing 132 can include, but is not limited to, distortion correction, color correction, object removal, fidelity filtering, object detection, motion tracking, semantic processing, photogrammetry, and the like. Distortion correction can include projection translations which permit the mapping of a video 112 geometry to any coordinate system, perspective, and the like. Color correction can include, specialized color balancing algorithms, true color algorithms, and the like. Object removal can utilize traditional (e.g., texture synthesis, multiple images) and/or proprietary technology to remove portions of background and/or foreground objects within video 112. Fidelity filtering can be leveraged to control the aberration in video sequences (e.g., high noise, low light). Object detection can be utilized to track objects within video to select appropriate point of views for an object, determine other objects obstructing the view of a tracked object, and the like.

In one embodiment, processing 132 can include semantic processing which can be utilized to determine the content of video 112. In the embodiment, video 112 content metadata (e.g., 134) can be utilized to match game element 122 with video 112, 114 to produce a meaningful content 124.

In one embodiment, processing 132 can include the creation of a three dimensional virtualized scene using stitching software such as MICROSOFT PHOTOSYNTH. In the embodiment, multiple perspectives can be utilized to create a content 124 which can permit user 128 to view different point of views of interest.

It should be appreciated that the disclosure can utilize one or more regions of the panoramic video 112. In one instance, video 112 can be cropped to focus video sequence 114 on relevant portions. For example, video 112 can be cropped to produce a five second video sequence (e.g., 114) of a lead car racing around a track which can be integrated into content 124 in a realistic manner. It should be understood that the disclosure can utilize individual frames, short sequences, long sequences, special effects, and the like.

As used herein, a video game can be an electronic game which involve human interaction with a user interface to generate visual feedback on a computing device within an environment 120. It should be appreciated that environment 120 can be executed within a computing device (e.g., device 126). Device 126 can include, but is not limited to, a video game console, handheld device, tablet computing device, a mobile phone, and the like. Environment 120 can include one or more user interactive elements 122. Elements can include, but not limited to, playable characters, non-playable characters, environmental elements, and the like. Environment 120 can conform to any genre including, but not limited to, a simulation genre, a strategy genre, a role-playing genre, and the like.

In one instance, content 124 can be a secondary content which can permit a user 128 to interact within an environment which resembles event 140. In the instance, overlays can be utilized to "skin" the appearance of environment to appear similar to event 140. In one embodiment, user 128 can interact with event 140 specific elements appearing within the content 124. For example, a user 128 can select a racing car within content 124 (e.g., which can be visually similar to vehicle 134) to experience a simulation of driving the vehicle 135 during event 140.

In one embodiment, the disclosure can extract car shell "templates" from video 112 which can enable the templates to applied within content 124. In the instance, the exterior appearance of a vehicle 135 within event 140 can be extracted and applied appropriately to an element 122 within content 124. For example, a truck shell template of a trucks competing in a Camping World Truck Series event can be extracted from video 112 to enable a car (e.g., 122) within a Sprint Cup Series content 124 to appear as a truck from the Camping World Truck Series.

As used herein, event 140 can be a real world occurrence within a real world environment. For example, event 140 can be a racing event such as a National Association for Stock Car Auto Racing (NASCAR) racing championship event. Event 140 can include, but is not limited to, real world participants (e.g., human spectators) and/or objects (e.g., vehicle 135). For example, event 140 can include racing cars travelling around a race track while spectators observe the race. Video 112 can be collected before, during, and/or after event 140 occurrence.

In one embodiment, camera 131 can convey video 112 wirelessly to a event server, archive server 111, broadcast server, and the like. It should be appreciated that video 112 can include data from multiple events 140, from one or more segments of an event 140, and the like. For example, video 112 can include video footage from multiple car races or multiple interval segments of a motorcycle race.

In one embodiment, the disclosure can be a game mode, a game modification (e.g., game mod), and the like. In one instance, content 124 can be a downloadable content such as a patch, a content expansion pack, and the like. For example, the content 124 can be accessible once a user 128 reaches a game checkpoint of completes a game achievement.

It should be appreciated that the disclosure can utilize traditional and/or proprietary mechanism to blend sequence 114 and element 122 within content 124. Mechanisms can include special effects and/or post production mechanisms including, but is not limited to, compositing (e.g., chroma keying), layering, and the like. It should be appreciated that content 124 can include additional content and is not limited to game element 122 and/or video sequence 114.

Drawings presented herein are for illustrative purposes only and should not be construed to limit the invention in any regard. It should be appreciated that the disclosure can shift pixels of sequence 114 to appear appropriately within content 124. It should be appreciated that the disclosure is not limited to automotive racing can be utilized in the context of team sports, athletics, extreme sports, and the like.

Figure 1B:
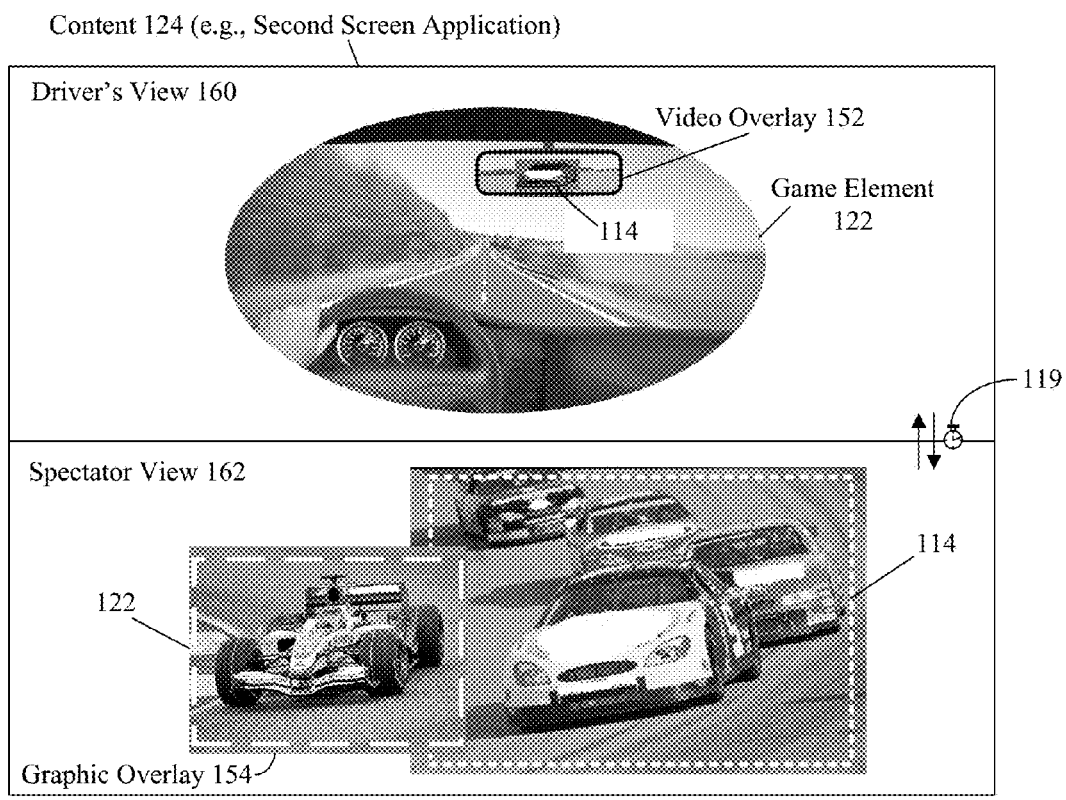
FIG. 1B is a schematic diagram illustrating a set of views for integrating panoramic video from a historic event with a video game in accordance with an embodiment of the inventive arrangements disclosed herein.
Figure 1B:
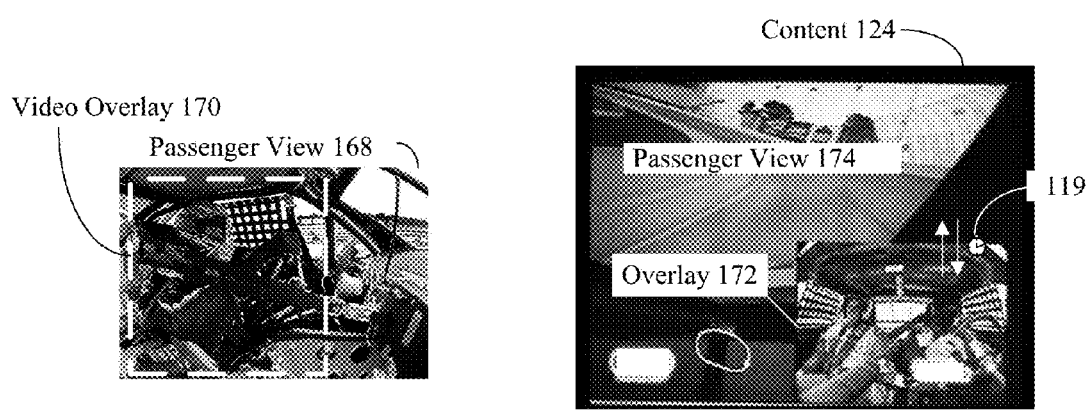

FIG. 1B shows multiple views 160, 162, 168, 174 which can be presented within interface 129. Views 160, 162, 168, 174 can include one or more game elements, video overlays (e.g., object 114), and the like. Views 160, 162, 168, 174 can be computer perspective based views, player character perspective based views, and the like.

In one instance, content 124 can include two views, a driver's 160 and a spectator 162 of a racing event. Each view 160, 162 can be a perspective view of a content 124 which can include interactive and non-interactive portions. In one embodiment, content 124 can be a video game application which can permit a user to select one or more computer based perspective views, where the computer based perspective views (e.g., 160, 162) can be generated utilizing video 112, 114 obtained from a past event. It should be appreciated that content 124 is not limited to simultaneous views and can support an arbitrary number of perspective views.

In driver's view 160, a game element 122 and a video overlay 152 can be presented. For example, game element 122 can be an interior of a car controlled by a user and overlay 152 can show an approaching vehicle in the rear view mirror. In one instance, video overlay 152 and element 122 can be synchronized to permit a realistic experience. For example, as the car moves further away from the approaching vehicle, the overlay 152 can be scaled appropriately, resulting in the appearance of speeding away from the vehicle. That is, driver view 160 can utilize a video sequence overlayed on a graphic element (e.g., game element 122) to create a simulated perspective view within content 124.

In spectator view 162, a graphic overlay 154 can be presented simultaneously with a video sequence 114 in a third person perspective view. For example, view 162 can show a user controlled car (e.g., 122) positioned alongside other competing cars (e.g., 114), where the competing cars are a portion of a video sequence 114 of a previously finished race. That is, spectator view 162 can utilize a graphic overlayed on a video sequence to create a perspective view within content 124.

In one embodiment, timing data 119 can be utilized to keep views 160, 160 in synchronicity.

Passenger view 168 can be a perspective view of a game content. In one instance, a video sequence from a passenger mounted camera can be utilized to enhance a computer based perspective view. In the instance, a video sequence 114 can be overlayed within the computer based perspective view. For example, a video of a real world driver can be used to obscure a computer avatar within overlay 170 to enhance the realism of the computer based perspective view.

In passenger view 174, a picture-in-picture (PiP) feature of a game can be utilized to present a video overlay 172. In one instance, overlay 172 can be synchronized 119 to the movement of a user interaction 127. In the instance, overlay 172 can utilize appropriate video sequences to improve the realism of a game experience. For example, a video sequence of a driver and passenger leaning left can be presented within the PiP window when a user steers the car around a left hand corner quickly.

In one embodiment, game data from a video game can be utilized to create a customized content. In the embodiment, session data including, but not limited to, game scoring, lap times, routes, and the like can be leveraged by the disclosure. For example, a user can select saved games with a best lap time of a NASCAR track to visually compare performance against historic video of professional drivers racing on an identical track. It should be appreciated that collision detection between video sequences and game elements can be resolved utilizing traditional (e.g., non-colliding geometry, bounding boxes) and/or proprietary techniques, and the like. For example, when a video sequence is detected to obscure a game element, one or more opaque layers can be utilized to block the game element from being viewed in an appropriate manner.

Figure 2:
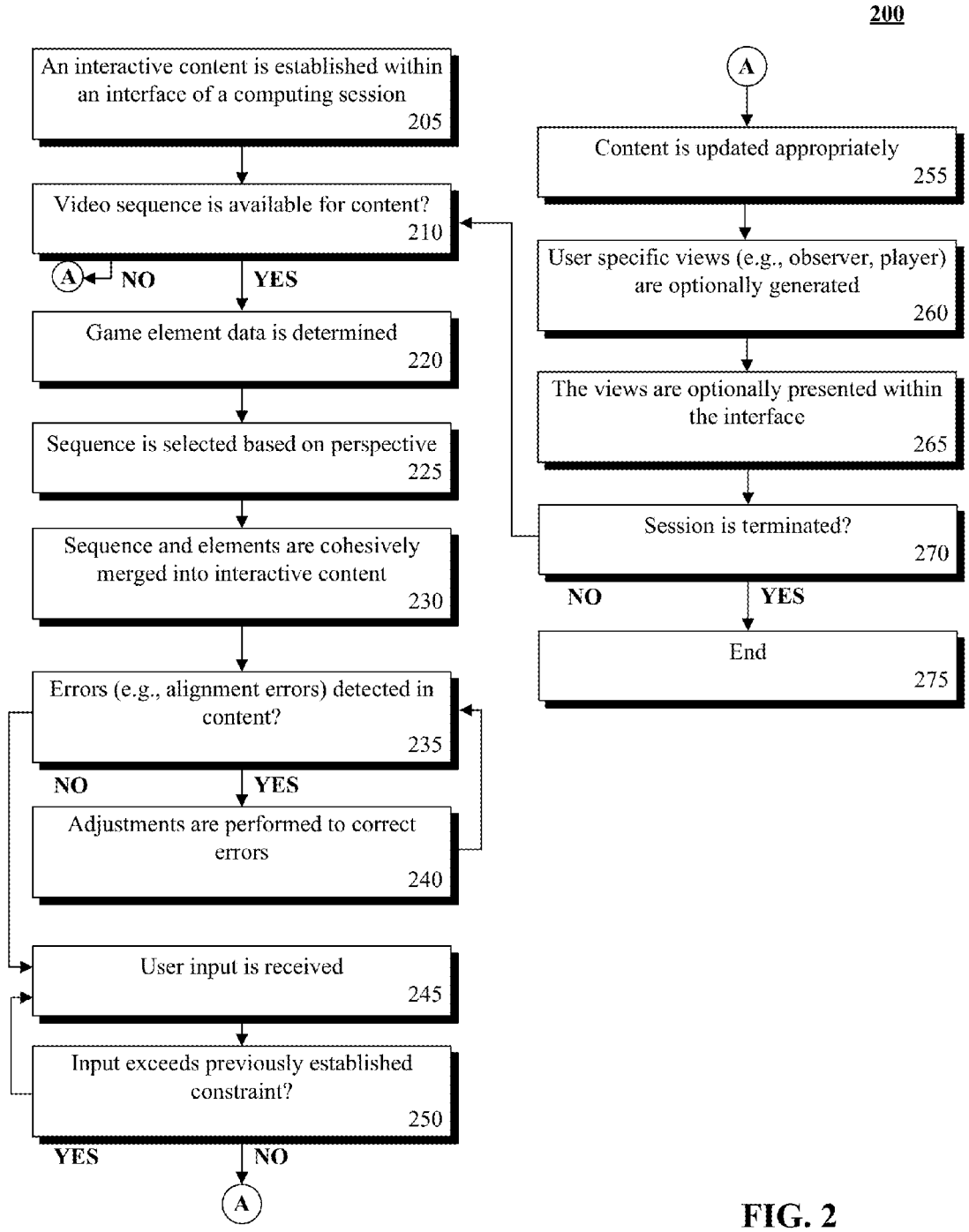
FIG. 2 is a schematic diagram illustrating a method for integrating panoramic video from a historic event with a video game in accordance with an embodiment of the inventive arrangements disclosed herein.

FIG. 2 is a schematic diagram illustrating a method 200 for integrating panoramic video from a historic event with a video game in accordance with an embodiment of the inventive arrangements disclosed herein. In method 200, a video footage from an event can be dynamically integrated into an interactive content.

In step 205, an interactive content can be established within an interface of a computing session. The computing session can be executed within a companion device. In step 210, if a video sequence is available for the content, the method can continue to step 220, else proceed to step 255. In step 220, game element data can be determined. Data can include, but is not limited to, point of view data, semantic data, element geometry, element texture, and the like. In step 225, a sequence can be selected based on perspective information obtained from game element data. In step 230, the sequence and elements can be cohesively merged into the interactive content. In step 235, if errors are detected in content, the method can continue to step 240, else proceed to step 245.

In step 245, a user input can be received. In step 250, if the input exceeds previously established constraints, the method can return to step 245, else continue to step 255. Constraints can be determined based on element data restrictions, video sequence limitations, user preferences, system settings, and the like. In step 255, the content can be updated appropriately based on input. The content can be updated utilizing traditional and/or proprietary video/graphic algorithms. In step 260, user specific views can be optionally generated. User specific views can include, but is not limited to, a first person perspective view (e.g., player character view), third person perspective view (e.g., observer view), and the like. In step 265, the views can be optionally presented within the interface. In step 270, if the session is terminated the method can continue to step 275, else return to step 210. In step 275, the method can end.

Drawings presented herein are for illustrative purposes only and should not be construed to limit the invention in any regard. It should be appreciated that method 200 can be performed in real-time or near real-time. Further, method 200 can be performed in serial and/or in parallel. Steps 210-270 can be performed continuously during the computing session to enable a video sequence and game element to be seamlessly integrated as a point of view of interactive content changes. It should be appreciated that method 200 can include additional steps which can permit the acquisition of additional event data (e.g., footage, semantic data) during the session.

Figure 3:
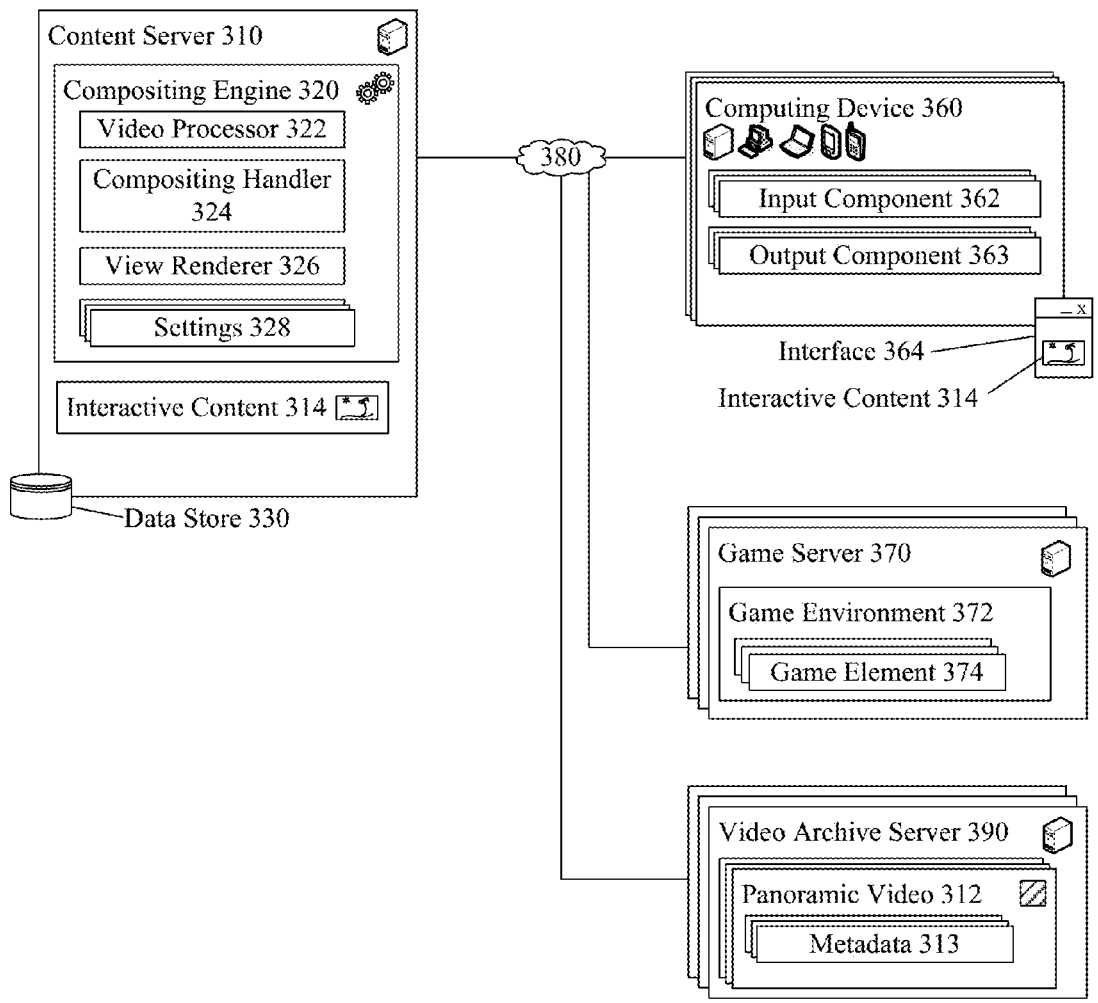
FIG. 3 is a schematic diagram illustrating a system for integrating panoramic video from a historic event with a video game in accordance with an embodiment of the inventive arrangements disclosed herein.

FIG. 3 is a schematic diagram illustrating a system 300 for integrating panoramic video from a historic event with a video game in accordance with an embodiment of the inventive arrangements disclosed herein. In system 300, a content server 310 can enable the creation of interactive content 314 which can be conveyed to device 360. In one embodiment, server 310 can be a component of a content delivery network.

Content sever 310 can be a hardware/software entity for enabling interactive content 314. Server 310 can include, but is not limited to, compositing engine 320, interactive content 314, data store 330, and the like. Server 310 functionality can include, but is not limited to, file serving, encryption capabilities, and the like. In one instance, server 310 can perform functionality to enable communication with game server 370, server 390, and the like. In one embodiment, server 310 can be a functionality of a pay-per-view subscription service.

Compositing engine 320 can be a hardware/software element for producing content 314. Engine 320 functionality can include, but is not limited to, image processing, video editing, and the like. In one embodiment, engine 320 can be a functionality of a graphics framework. In one instance, engine 320 can determine one or more relevant portions (e.g., dynamic content) of content 314 to be conveyed to device 360. In the instance, relevant portions can be conveyed 314 while non-relevant portions (e.g., static content) can be omitted. That is, engine 320 can compensate for real world limitations including, but not limited to network latency, computing resource availability, and the like. It should be appreciated that engine 320 can perform caching functionality to enable real-time or near real-time content 314 delivery and/or presentation.

It should be appreciated that engine 320 can allow for manual oversight and management of the functionality described herein. For example, engine 320 can permit an administrator to approve or reject a video and/or a game element prior to use within content 314.

Video processor 322 can be a hardware/software entity for processing panoramic video 312. Processor 322 functionality can include traditional and/or proprietary functionality. In one embodiment, processor 322 can include pre-processing functionality including, but not limited to, metadata 313 analysis, video acquisition and/or filtering, and the like.

Compositing handler 324 can be a hardware/software element for merging video 312 and element 374 into an interactive content 314. Handler 324 can utilize traditional and/or proprietary functionality to cohesively integrate video 312 and element 374 into an interactive content 314.

View renderer 326 can be a hardware/software entity for presenting a perspective view of interactive content 314. Renderer 326 functionality can include, but is not limited to, environment 372 analysis, element 374 analysis, environment mapping analysis, and the like.

Settings 328 can be one or more rules for establishing the behavior of system 300, server 310, and/or engine 320. Settings 328 can include, but is not limited to, video processor 322 options, compositing handler 324 settings, view renderer 326 options, and the like. In one instance, settings 328 can be manually and/or automatically established. In the embodiment, settings 328 can be heuristically established based on historic settings. Settings 328 can be persisted within data store 330, computing device 360, and the like.

Interactive content 314 can be one or more digital media which can permit user interaction to affect content 314 state. Content 314 can conform to traditional and/or proprietary formats including, but not limited to, an ADOBE FLASH format, a JAVA format, and the like. That is, content 314 can be a Web based application. It should be appreciated that content 314 is not limited to Web based platforms and can include desktop application platforms, video game console platforms, and the like. In one embodiment, content 314 can be access restricted (e.g., pay-per-view, age restricted) based on one or more provider settings (e.g., 328), licensing restrictions, and the like. In one instance, content 314 can be executed within a sandbox which can address potential security pitfalls without markedly decreasing performance of the content 314. It should be appreciated that content 314 can include single player functionality, multiplayer functionality and the like.

Data store 330 can be a hardware/software component able to persist content 314, element 374, video 312, and the like. Data store 330 can be a Storage Area Network (SAN), Network Attached Storage (NAS), and the like. Data store 330 can conform to a relational database management system (RDBMS), object oriented database management system (OODBMS), and the like. Data store 330 can be communicatively linked to server 310 in one or more traditional and/or proprietary mechanisms. In one instance, data store 330 can be a component of Structured Query Language (SQL) complaint database.

Computing device 360 can be a software/hardware element for collecting user input and/or presenting content 314. Device 360 can include, but is not limited to, input components 362 (e.g., keyboard, camera), output components 363 (e.g., display), interface 364, and the like. In one instance, interface 364 can be a Web based interface (e.g., rich internet application media player). Device 360 hardware can include but is not limited to, a processor, a non-volatile memory, a volatile memory, a bus, and the like. Computing device 360 can include but is not limited to, a desktop computer, a laptop computer, a mobile phone, a mobile computing device, a portable media player, a Personal Digital Assistant (PDA), a video game console, an electronic entertainment device, and the like.

Game server 370 can be a hardware/software entity for executing game environment 372. Server 370 can include, but is not limited to, virtual game world server, a gateway server, a game content server, an e-commerce server, and the like. In one embodiment, server 370 can communicate with server 310 to convey relevant game elements 374 as requested by server 310. In one embodiment, game server can be utilized to can convey perspective data to server 310 and/or engine 320. In one instance, game server 370 can be utilized to support multiplayer interaction with content 314.

Game environment 372 can be one or more virtual environments associated with a video game. Environment 372 can include, but is not limited to, game maps, elements 374. Environment 372 can include two dimensional environments, three dimensional environments, and the like. Environment 372 can include static elements, dynamic elements, and the like.

Video archive server 390 can be a hardware/software entity for persisting and/or conveying video 312. Server 390 can execute a digital asset management software which can index video 312 based on one or more criteria including, but not limited to, metadata 313, user input (e.g., keywords), and the like.

Network 380 can be an electrical and/or computer network connecting one or more system 300 components. Network 380 can include, but is not limited to, twisted pair cabling, optical fiber, coaxial cable, and the like. Network 380 can include any combination of wired and/or wireless components. Network 380 topologies can include, but is not limited to, bus, star, mesh, and the like. Network 380 types can include, but is not limited to, Local Area Network (LAN), Wide Area Network (WAN), Virtual Private Network (VPN) and the like.

Drawings presented herein are for illustrative purposes only and should not be construed to limit the invention in any regard. It should be appreciated that one or more components within system 300 can be optional components permitting that the disclosure functionality be retained. It should be understood that engine 320 components can be optional components providing that engine 320 functionality is maintained. It should be appreciated that one or more components of engine 320 can be combined and/or separated based on functionality, usage, and the like. System 300 can conform to a Service Oriented Architecture (SOA), Representational State Transfer (REST) architecture, and the like.

The flowchart and block diagrams in the FIGS. 1A-3 illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. A method for integrating panoramic video with a video game comprising:

receiving, via a computing device comprising hardware and software, a panoramic video captured by a camera of a moving vehicle of a real world event, wherein the video comprises of perspective data linked with a video timeline;

determining, via the computing device, a perspective view associated with a game vehicle of a graphics of a video game linked with a game timeline at a first time index, wherein the graphics includes an interactive graphics object for the game vehicle controlled by a user of the video game in which the game vehicle moves in a game environment per user input, wherein the graphics interactively shows the game vehicle in a third person perspective;

processing, via the computing device, the perspective data of the panoramic video to obtain a video sequence, from the panoramic video matching the perspective view associated with the graphics at a second time index, wherein the video sequence shows an interior of the moving vehicle in addition to showing at least one occupant of the moving vehicle;

synchronizing the video timeline and the game timeline based on a common time index of each of the timelines; and integrating the graphics and the video sequence into an interactive content, responsive to the synchronizing, such that motion of the moving vehicle from the video sequence is synchronized to match motion of the game vehicle as controlled by the user, wherein the graphics showing the game vehicle in third person perspective and the video segment are concurrently included for presentation within a user interface of the video game responsive to the integrating step.

2. The method of claim 1, further comprising:
presenting, via the computing device, the graphics and the video segment within the user interface.

3. The method of claim 1, wherein changes of playback of the video segment during the video game using affects a portion of the gaming vehicle as shown in the user interface.

4. The method of claim 1, further comprising:
embedding, via the computer, the perspective data within multiple frames of the video sequence.

5. The method of claim 1, further comprising:
simultaneously presenting, via the computer, the interactive content on a computing device during a mass communication broadcast of the event.

6. The method of claim 1, further comprising:
detecting, via the computing device, a change in the perspective view within the interactive content from a previous perspective to a subsequent perspective view; and
updating, via the computing device, the interactive content with a graphics and a video sequence matching the subsequent perspective view to maintain continuity of the content.

7. The method of claim 1, further comprising:
overlaying, via the computing device, the video sequence within the interactive content, wherein the sequence obscures at least a portion of a computer based view.

8. The method of claim 1, further comprising:
overlaying, via the computing device, the graphics within the interactive content, wherein the graphics obscures at least a portion of a video sequence.

9. The method of claim 1, wherein the interactive content is a downloadable content associated with the video game, wherein the downloadable content is accessible responsive to a video game achievement.

10. A system for integrating panoramic video with a video game comprising:
- a compositing engine configured to generate an interactive content comprising of a video game graphics and a video sequence, wherein the video game graphic includes an interactive graphics object for a game vehicle of a video game environment shown in a first viewing perspective, wherein the video sequence is captured by a camera of a moving vehicle of a real world event, wherein video sequence shows an interior of the moving vehicle from a second viewing perspective, which is different from the first viewing perspective, wherein movement of game vehicle is interactively controlled by user input, wherein the compositing engine time synchronizes the video sequence and the game vehicle such that motion of the moving vehicle from the video sequence is synchronized to match motion of the game vehicle as controlled by the user, wherein the video sequence is a portion of a panoramic video; and
- a data store able to persist at least one of the interactive content and a panoramic video metadata.

11. The system of claim 10, further comprising:
- a computing device receiving the panoramic video, wherein the video segment comprises of perspective data linked with a video timeline;
- the computing device determining a perspective view associated with a graphics of a video game linked with a game timeline at a first time index;
- the computing device processing the perspective data of the panoramic video to obtain a video sequence matching the perspective view associated with the graphics at a second time index;
- the computing device synchronizing the video timeline and the game timeline based on a common time index of each of the timelines; and
- the computing device integrating the graphics and the video sequence into the interactive content, responsive to the synchronizing.

12. The system of claim 10, further comprising:
- a computing device presenting the interactive content within an user interface.

13. The system of claim 10, wherein the video is obtained from a camera comprising of multiple different fixed directional lenses and a stitching lens.

14. The system of claim 10, wherein
- a computing device embedding the perspective data within multiple frames of the video sequence.

15. The system of claim 10, further comprising:
- a companion device simultaneously presenting the interactive content on a computing device during a mass communication broadcast of the event.

16. The system of claim 10, further comprising:
- a companion device detecting a change in the perspective view within the interactive content from a previous perspective to a subsequent perspective view; and
- the companion device updating the interactive content with a graphics and a video sequence matching the subsequent perspective view to maintain continuity of the content.

17. The system of claim 10, further comprising:
- the companion device overlaying the video sequence within the interactive content, wherein the sequence obscures at least a portion of a computer based view.

18. The system of claim 10, further comprising:
- the companion device overlaying the graphics within the interactive content, wherein the graphics obscures at least a portion of a video sequence.

19. The system of claim 10, wherein the interactive content is a downloadable content associated with the video game, wherein the downloadable content is accessible responsive to a video game achievement.

20. A non-transitory computer readable storage medium having computer usable program code embodied therewith, the computer usable program code comprising:
- computer usable program code stored in a non-transitory storage medium, if said computer usable program code is executed by a processor it is operable to receive a panoramic video captured by a camera of a moving vehicle of a real world event, wherein the video comprises of perspective data linked with a video timeline;
- computer usable program code stored in a non-transitory storage medium, if said computer usable program code is executed by a processor it is operable to determine a perspective view associated with a game vehicle of a graphics of a video game linked with a game timeline at a first time index, wherein the graphics includes an interactive graphics object for the game vehicle controlled by a user of the video game in which the game vehicle moves in a game environment per user input, wherein the graphics interactively shows the game vehicle in a third person perspective;
- computer usable program code stored in a non-transitory storage medium, if said computer usable program code is executed by a processor it is operable to process the perspective data of the panoramic video to obtain a video sequence, from the panoramic video matching the perspective view associated with the graphics at a second time index, wherein the video sequence shows an interior of the moving vehicle in addition to showing at least one occupant of the moving vehicle;
- computer usable program code stored in a non-transitory storage medium, if said computer usable program code is executed by a processor it is operable to synchronize the video timeline and the game timeline based on a common time index of each of the timelines such that motion of the moving vehicle from the video sequence is synchronized to match motion of the game vehicle as controlled by the user; and
- computer usable program code stored in a non-transitory storage medium, if said computer usable program code is executed by a processor it is operable to integrate the graphics and the video sequence into an interactive content, responsive to the synchronizing.

* * * * *